United States Patent [19]
Batten, Jr. et al.

[11] Patent Number: 6,147,879
[45] Date of Patent: Nov. 14, 2000

[54] ASSEMBLIES OF ELECTRICAL DEVICES AND FLEXIBLE CONTAINERS THEREFOR

[75] Inventors: L. Eugene Batten, Jr., Angier; Dennis A. McCulloch; Mark J. Fordham, both of Chapel Hill, all of N.C.

[73] Assignee: Nortel Networks Limited, Montreal, Canada

[21] Appl. No.: 08/989,719

[22] Filed: Dec. 12, 1997

[51] Int. Cl.[7] ....................................................... H05K 7/14
[52] U.S. Cl. ........................ 361/800; 361/799; 361/800; 361/816; 361/818; 174/35 R; 174/35 GC; 439/76.1
[58] Field of Search ..................................... 361/800, 816, 361/818, 799, 798; 174/35 R, 35 GC; 439/67, 76.1

[56] References Cited

U.S. PATENT DOCUMENTS

| | | | |
|---|---|---|---|
| 5,436,803 | 7/1995 | Amis et al. | 361/818 |
| 5,527,989 | 6/1996 | Leeb | 174/35 GC |
| 5,545,494 | 8/1996 | Trumble et al. | 429/163 |
| 5,739,463 | 4/1998 | Diaz et al. | 174/35 R |

*Primary Examiner*—Leo P. Picard
*Assistant Examiner*—Tuan Dinh
*Attorney, Agent, or Firm*—Foley & Lardner

[57] ABSTRACT

A flexible container and method for its manufacture, the container provided for housing an electronic device. e.g. a printed circuit board. The container has a laminate wall with a dielectric layer facing into a chamber defined by the container, and an EMI protection layer surrounding the dielectric layer. An opening is provided to the chamber to accept the electronic device and a wall region of the container holds electrically conductive elements which are isolated from each other and from the EMI protection layer. The conductive elements connect conductors on the inside of the chamber to conductors outside the container. The wall region is conveniently provided by a preformed panel which bridges a container aperture. An assembly of electronic device and container is also provided. A common opening may be provided for device acceptance and for location of the preformed panel. Also, instead of the conductive elements in the panel, insulated conductor wires extend from the electronic device, through and in sealing engagement with the panel, to extend beyond the container.

24 Claims, 5 Drawing Sheets

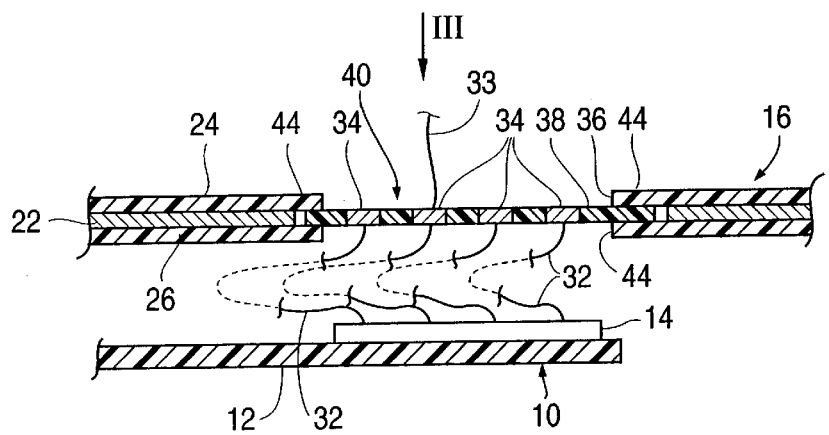
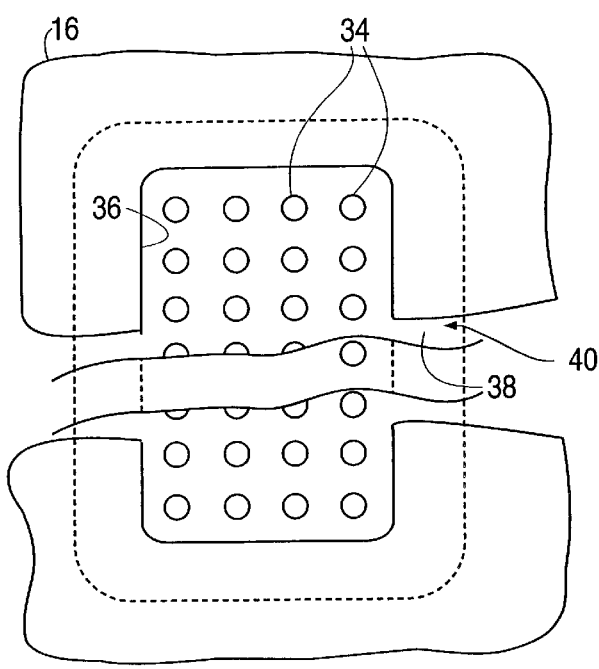
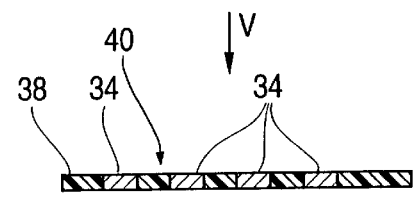
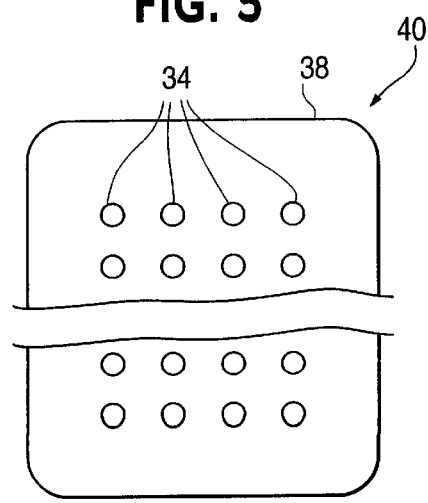

ASSEMBLIES OF ELECTRICAL DEVICES AND FLEXIBLE CONTAINERS THEREFOR

This invention relates to electronic devices within flexible containers.

In the electronics industry, electronic devices, e.g. printed circuit boards, are conventionally incorporated into equipment. Depending upon the usage of printed circuit boards particularly, it may be required to prevent electromagnetic radiation from passing to or from electronic components mounted upon the boards because of the electromagnetic interference (EMI) which results. Up to the present time it has been conventional practice to provide EMI shielding around an entire printed circuit board by housing the printed circuit board with a conductive rigid metal shield forming part of an assembly with the printed circuit board. The metal shield is grounded to provide the required EMI protection. An electrical connector is necessary to connect the printed circuit board with electrical equipment or a power source exteriorly of the shield. Conventional arrangements have proved to be unsatisfactorily expensive, occupy an inordinately large spacial volume as compared to the volume of the printed circuit board and its electronic components, and require many manufacturing steps. In an effort to overcome the above problems, a U.S. Pat. No. 5,545,494 to W. P. Trumble et al describes an assembly of printed circuit board and a flexible container around the board and in which EMI protection is provided by a conductive flexible metal layer as an inner layer of the container wall. The container has an opening within which a connector of the board is mounted with the opening to the container being sealed around a peripheral surface of the body of the connector. Not only is EMI protection provided, but also the inside of the container and thus the printed circuit board and its electronic components are protected from dust or any other airborne contamination. A problem with the construction described in the above patent is that the connector body needs to be sufficiently large in size for the container to seal around it at the container opening. A body of this size is much larger than would otherwise be necessary merely to be mounted upon a printed circuit board for conveying signals to and from the board. The structure is therefore cumbersome.

The present invention seeks to provide a solution to the above problems while providing for an assembly of an electronic device and flexible container and which also provides for a different manner of electrically connecting the electronic device with electrical equipment or a power source exteriorly of the container.

According to one aspect of the present invention, there is provided a flexible container defining a chamber for containing an electronic device, the container having a laminate construction wall and comprising a dielectric layer facing inwardly into the chamber and an EMI protection layer surrounding the dielectric layer, and the container also having a closeable opening to the chamber and a plurality of electrically conductive elements present in a wall region of the container, the conductive elements being electrically isolated from each other and also from the EMI protection layer, with each of the elements having one end facing into the chamber for electrical connection to a conductor within the container and another end facing outwards from the chamber for electrical connection to a conductor outside the container.

A flexible container as defined according to the above invention may be used for connecting a printed circuit board with electrical equipment or an electrical power source located exteriorly of the container. The invention has for its basic requirement, a container structure in which electrical signals or electrical power are to be passed through the electrically conductive elements present in the wall region of the container. Hence, with the container according to the invention, individually insulated electrical wires on the inside of the container (i.e.within the chamber) are connectable to the electronic device contained therein and other electrical conductors outside the container are connectable either to electrical equipment or to an electrical source. The problems associated therefore with the Prior Art including the structure described in U.S. Pat. No. 5,545,494 referred to above are completely avoided.

In a practical construction, the laminate construction wall of the container defines an aperture to the chamber and an assembly of a carrier and the electrical conductive elements is provided, the carrier holding the elements and bridging and closeably sealing the aperture. In this practical arrangement, the container may thus be made including the aperture preparatory to the adding thereto of the assembly of carrier and the electrically conductive elements. Thus, this assembly is separately formed to be sealably positioned over the aperture of the container. Hence, this particular arrangement results in a simplified manufacturing process in which the electrically conductive elements are provided upon a relatively small structure, i.e. the carrier, as distinct from it being necessary for it to be assembled to the laminate construction wall, i.e. the larger entity, of the container itself. Any problems in accurately disposing the electrically elements in large expanses of material for the laminate construction wall are thereby avoided. It is also to be preferred that the laminate construction wall comprises at least three layers which includes a further dielectric layer surrounding the EMI protection layer. With this arrangement, around marginal regions to the aperture, the dielectric layers may provide aperture defining dielectric projections which extend beyond the EMI protection layer and the carrier has edge regions which extend between and are sealed to the projections. Alternatively, the carrier is disposed so as to be sealed against either the outer surface or the inner surface of the laminate structure wall.

The inner dielectric layer of the flexible container is provided to prevent electrical shorting of electrical pathways of the electronic device in the event that the device or wiring thereto contact the inner surface of the container. For the same reason, advantageously in a practical arrangement the carrier itself should have an inner dielectric surface. It is preferable, however, for the carrier to be of laminate construction which includes an EMI protection carrier layer electrically isolated from the electrical conductive elements. The invention further includes a method of making a flexible container defining a chamber for containing an electronic device comprising: providing a partly finished container comprising a laminate construction wall having a dielectric layer facing inwardly into the chamber and an EMI protection layer surrounding the dielectric layer, the laminate construction wall defining a closeable opening to the chamber; forming an aperture of desired shape and size through the laminate construction wall of the partly finished container; and bridging and closing the aperture with a carrier which includes at least one dielectric carrier layer and a plurality of electrically conductive elements held by the carrier, the conductive elements being electrically isolated from each other and also from the EMI protection layer and each element having conductive ends located at opposite sides of the carrier, the carrier being sealingly secured to the laminate construction wall with the conductive ends of the conductive elements providing ends facing into the chamber for electrical connection to the electronic device and ends facing out from the container for connection to a conductor outside the container.

The invention also includes an assembly of an electronic device inside a flexible container in which the electronic device has an electrical connector mounted upon it and the flexible container defines a closed chamber containing the electronic device with the container also comprising a laminate construction wall which includes a dielectric layer facing inwardly into the chamber and an EMI protection layer surrounding the dielectric layer and in which the assembly has individually insulated conductors electrically connected to electrical terminals of the electronic device with first parts of the conductors flexibly extending from these electrical terminals to a wall region of the container while second parts of the conductors extend through and are held by the wall region of the container to provide ends facing outwards for connection to electrical conductors outside the container. These conductors are insulated from each other and also from the EMI protection layer.

In the above assembly of the invention, the second parts of the electrical conductors may comprise electrical conductor elements having inner and outer ends as discussed according to the invention above. Alternatively, the whole of each electrical conduct or is provided by a conductor wire which extends through the container wall to provide exterior wire portions for connection to electrical equipment or to an electrical power source exteriorly of the container.

The invention further includes a method of assembling an electronic device inside a flexible container in which the flexible container defines the chamber and an opening to the chamber for insertion of the device into the chamber. With this method, the electronic device with an electrical connector mounted thereon and first parts of individually insulated electrical conductors electrically connected to terminals of the connector, the device is inserted through the opening into the chamber. With the first parts of the conductors within the chamber and second parts of the conductors extending through a wall region of the chamber and being electrically isolated from an EMI protection layer of the container and outer ends of the conductors facing outwards from the container for connection to electrical conductors exteriorly of the chamber, the opening is closed and sealed.

With the above assembly and method of forming the assembly, while it is recognised that in certain arrangements the wall region may be provided by the carrier which covers an aperture and also in which an opening, in addition to the aperture, is provided for insertion of the electronic device, such is by no means a requirement of the invention. It is indeed possible for an opening to be provided through the laminate wall structure of the container through which the electronic device is inserted, lo the opening itself then being sealed by the carrier which includes the second parts of the electrical conductors.

Embodiments of the invention will now be described, by way of example, with reference to the accompanying drawings, in which:

FIG. 2a is a view similar to FIG. 2 of another part of the assembly of the first embodiment;

FIG. 3 is a view in the direction of arrow 111 in FIG. 2a of part of the assembly;

FIG. 4 is a cross-sectional view similar to FIG. 2 of a preformed assembly of a carrier and electrical conductive elements incorporated into the container of the first embodiment;

FIG. 5 is a plan view in the direction of arrow V in FIG. 4;

Figure 1:
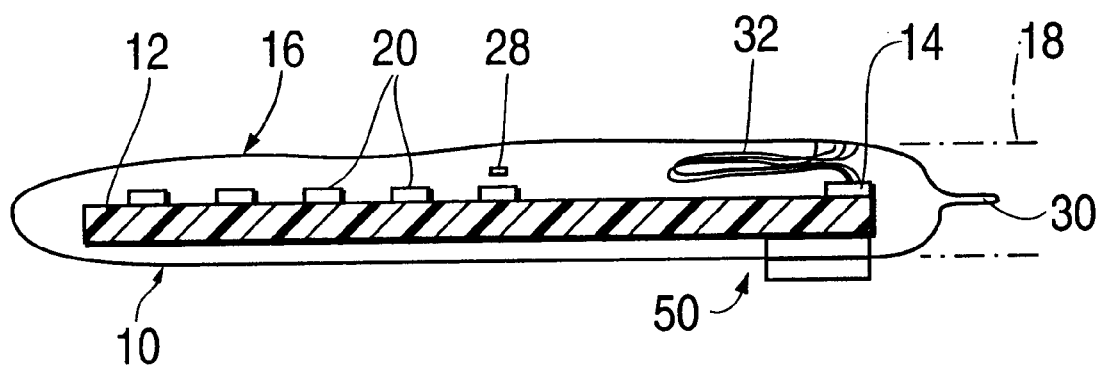
FIG. 1 is a side elevational diagrammatic view in cross-section of an assembly of an electronic device in the form of a printed circuit board disposed within a flexible container and according to a first embodiment.

In a first embodiment as shown in FIG. 1, an assembly 10 of a printed circuit board and flexible container comprises a printed circuit board 12 of conventional construction, the printed circuit board having an elongate electrical connector 14 connected along one edge region of the board in conventional manner.

Figure 2:
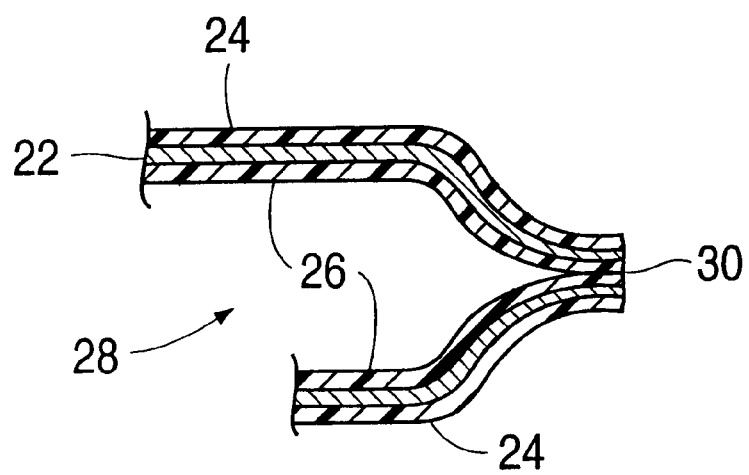
FIG. 2 is a cross-sectional view similar to FIG. 1 but on a larger scale of part of the assembly of the first embodiment.

A flexible container 16 of the assembly is manufactured with an open end 18 (shown in chaindotted in FIG. 1) and into which the printed circuit board 12 and accompanying connector 14 has been inserted as a sub-assembly. The container 16 is of laminate construction wall and requires an EMI protection layer for the purpose of preventing or substantially diminishing the amount of magnetic radiation penetrating the container either to or from electronic components 20 mounted upon the printed circuit board. For this, as shown by FIGS. 2 and 2a, a thin metal layer 22 (e.g.copper or other suitable conductive material) is provided intermediate inner and outer layers of the container. The layer 22 may be of any desired thickness while being suitable for its desired purpose. It is found that a thickness down to 0.5 mil will suffice. The layer 22 is also imperforate and thus also serves as a moisture or other fluid barrier through the wall of the container. Alternatively, the layer 22 is perforate while still satisfying its EMI protection requirements and a specific moisture impermeable layer (not shown) is then included in the container. This specific layer may, for instance, be made from polyvinylidene chloride (such as sold under the Trademark "Saran"). An outer layer 24 is required to provide strength to the container and also to have abrasion and cutting resistance. In addition, it should also have dielectric properties. Any suitable polymeric material may do for this purpose, e.g polyethyleneterephthalate, possibly sold under the trade name "Mylar". Other materials are also suitable including polypropylene or polyamide. The outer layer is of a desired thickness to provide required flexibility. A thickness of at least 1 mil is found suitable.

An inner layer 26 which faces inwardly into a chamber 28 (FIG. 1) within the container needs also to be of dielectric material (basically to prevent shorting of circuitry on the printed circuit board should the container contact any surface of the board or contact any electrical conductor carried by the board). With the particular requirements of the container, it is also necessary for the material of the inner layer to be such that it will fuse and heatseal to itself. A suitable material, and as used in this embodiment, is polyethylene. As shown by FIGS. 1 and 2, marginal edge regions 30 of the container 16 at the opening 18 have been brought together with inside surfaces provided by the polyethylene inner layer 26 abutted and then heatsealed together. An airtight seal along the fused together marginal edge regions 30 is thus provided airtightly sealing the chamber 28 within the container from the outside environment.

The printed circuit board 12 communicates electrically with equipment exteriorly of the container 16 by means of a plurality of individually insulated conductors which extend from terminals of the connector 14 to present ends facing outwardly from the container for connection to the electrical equipment exteriorly of the container. In this particular embodiment these individually insulated conductors comprise a plurality of individually insulated conductor wires 32 (see FIGS. 1 and 2a) which extend from the terminals of the connector 14 and are soldered to electrically conductive elements 34 which are carried by the wall of the container as will now be described. As already indicated, the wall of the container is a laminate construction wall comprising the three layers 22, 24 and 26. However, in this embodiment the laminate construction wall is formed with an elongate aperture 36 (see FIG. 3) which preferably overlies the position of the connector 14. The aperture 36 is bridged and sealingly closed by a carrier 38 of a preformed assembly 40 of the carrier and the electrically conductive elements 34. This assembly 40 of the carrier 38 and the aperture 36 is shown in FIGS. 4 and 5. As shown by these figures, the carrier 38 is a single layer of a dielectric material, e.g. polyethylene, polypropylene or polyamide for instance, which may be bonded or heat sealed to either or both of the inner and outer layers 24 and 26 of the laminate construction wall. The dielectric material of the carrier 38 holds the electrically conductive elements 34 spaced apart and electrically isolated from each other and conveniently these elements are relatively positioned in a pattern which corresponds to the pattern of the terminals in the connector 14 from which the conductor wires 32 extend. Thus, each of the elements 34 has an end facing inwardly into the container 16 which is connected to a corresponding conductor wire 32, and another end which faces outwardly from the container and is exposed for soldering to another insulated conductor wire, e.g. as shown as item 33 FIG. 2a, and which extends to other electrical equipment or to an electrical power source. The aperture 36, as shown by FIG. 2a, has marginal regions provided by aperture defining dielectric projections 44 of the layers 24, 26 which project outwardly beyond the EMI protection layer. The carrier 38 is inserted between the projections 44 and is bonded or heat sealed thereto as required to seal across the aperture. The boundary of the carrier 38 is shown in FIG. 3 which indicates that all the marginal regions of the carrier lie between the projections 44.

Hence, it follows that in the first embodiment, and as shown in FIGS. 1 to 3, in the assembly the electronic device in the form of the printed circuit board 12 is sealingly contained within the chamber 16 and it is possible for the circuitry of the board to make electrical connection with electrical equipment, positioned outside the container by the insulated conductor wires 32 and the electrically conductive elements 34 carried by the carrier 38. It may be seen, therefore, that with the first embodiment (and also with embodiments to be described) the invention provides a constructional assembly in which the use of a connector mounted upon and sealed directly to a flexible container is completely avoided for conveying electrical signals or power to and from a printed circuit board within the container.

In addition, the method of making such an assembly including manufacture of the container itself may be quite economical and simple as will now be described. Firstly in the manufacture of the container, because the electrically conductive elements 34 are mounted in a separate carrier 38, then these elements need only be relatively positioned within the carrier without their relationship being determined initially to the laminate construction wall. The assembly of the elements 34 and the carrier 38 are simple compared to an alternative assembly of, and positioning of the elements 34, directly into the laminate construction wall itself.

Figure 6:
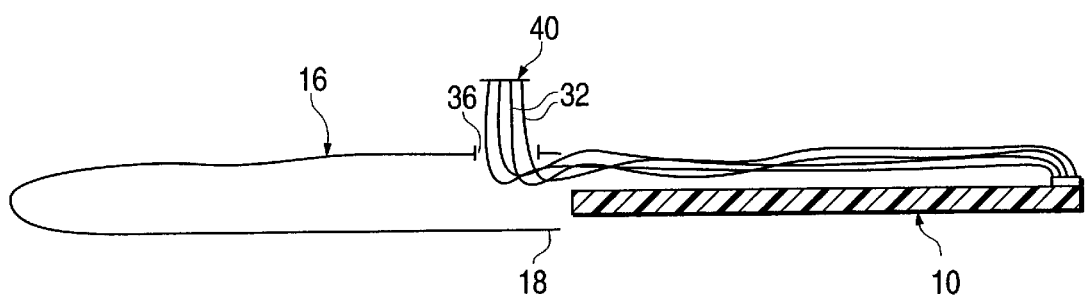
FIGS. 6, 7 and 8 are views similar to FIG. 1 showing different stages in assembling the printed circuit board into the flexible container.
Figure 7:
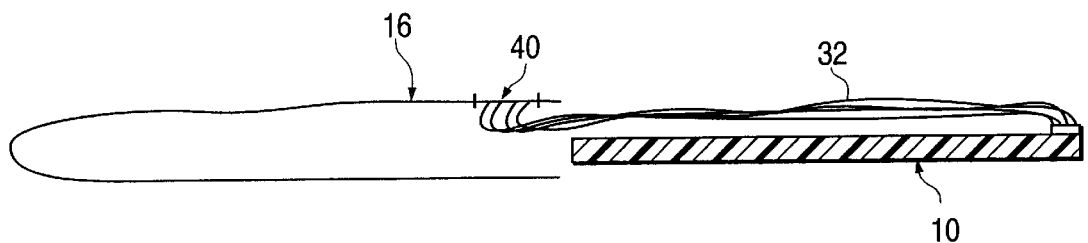
Figure 8:
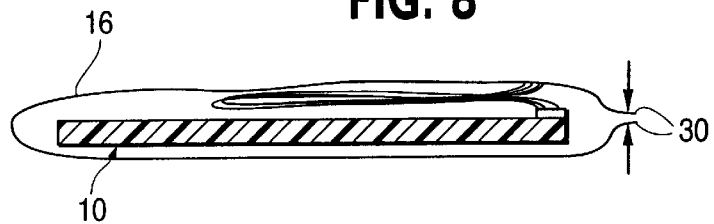

Secondly, the assembly of the printed circuit board into the container is also simple and economical. In one preferred method of providing this assembly, and as shown by FIGS. 6, 7 and 8, the printed circuit board 12 is initially positioned outside the container 16 with the connector 14 mounted upon the board. The individually insulated conductor wires 32 are connected to terminals of the connector 14 and have their other ends pre-soldered to the electrically conductive elements 34 before the assembly of board and connector is mounted in position within the container wall. FIG. 6 shows the board 10 and connector 14 exteriorly of the container with the conductors 32 extending through the open end 18 and through the aperture 36 to be soldered to the elements 34. The assembly 40 is then inserted in position into the laminate construction wall as shown in FIG. 2a and is sealed therein. With the printed circuit board 12 inserted through the open end 18 and residing within the chamber 28, the open end 18 is sealed by a heat sealing process to provide the closed end 30. The polyethylene layer 26 is easily heat sealed to itself for this sealing step. FIGS. 7 and 8 show firstly the assembly 40 located and sealed in position and then the closed end 30 being formed. It should be stressed, however, that the assembly steps after the wires 32 have been soldered to the conductive elements 34 may be easily changed while providing the same result. Hence, the printed circuit board and connector 14 may be positioned within the chamber 28 before the assembly 40 is located into position and sealed therein and the aperture 36 may be closed and sealed either before or after the closing and sealing of the open end 18 of the container.

Figure 9:
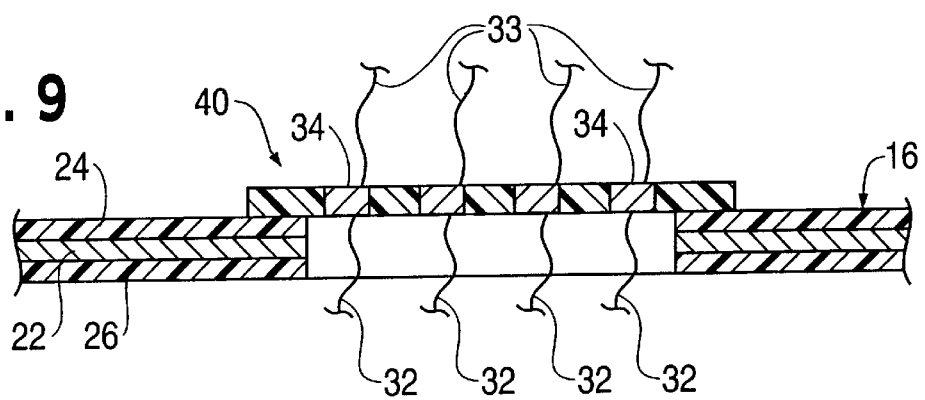
FIGS. 9 and 10 are views similar to FIG. 2 of second and third embodiments of the invention.

It is not essential for the structure to be made with the carrier 38 mounted between projecting portions of the dielectric layers as shown in FIG. 2. For instance, as shown by a second embodiment in FIG. 9, the carrier 38 is bonded to the outside surface of the container 16, i.e. the outside surface of the layer 24, and the aperture 36 may be of the same size and dimensions right through the laminate construction wall without the projections 44 being provided.

Figure 10:
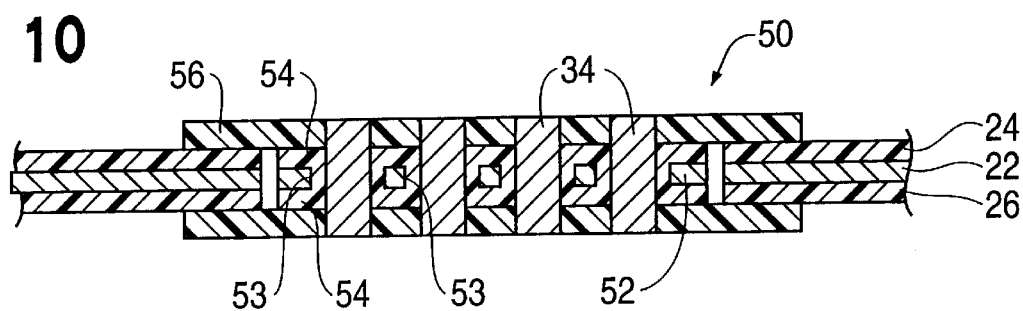

It may be discovered that the EMI protection provided by the EMI protection layer 22 is insufficient to prevent substantial EMI radiation through the region provided by the aperture 36. In such conditions, it is preferable to provide an assembly for the electrically conductive elements which also includes its own EMI protection layer. One example of this is given in the third embodiment as shown by FIG. 10. In this embodiment, a carrier 50 comprises an EMI protection layer 52 which may be of the same material as the layer 22 and of similar thickness. On either side of the EMI protection layer 52 is provided a dielectric layer 54 of any suitable polymeric material. Each layer 54 is of suitable size and shape to fit within the aperture 36. An outer layer 56 which projects outwardly beyond the layer 54 in all directions, overlaps the marginal regions of the aperture provided by layer 24 and is bonded to the layer 24. The layer 56 may be of the same material as the layer 24. An inner layer 58 of similar dimensions to the layer 56 overlaps the inner layer 26. The layer 58 is conveniently of the same material as the layer 26 and is heat sealed thereto. As may be seen from the construction of the third embodiment, the EMI protection layer 52 will prevent EMI radiation through the area provided by the aperture 36 with the assembly 50 in position in the finished assembly. The EMI protection layer 52 has clearance holes 53 to space it from the conductive elements 34 and dielectric polymeric material lying within the clearance holes electrically isolates the elements 34 from the layer 92.

In the above embodiments it has been shown that individually insulated conductors extending from the connector 14 include a wire portion 32 and electrically conductive elements 34 mounted in a carrier. This is by no means an essential construction of the invention as will now be shown by the fourth embodiment.

Figure 11:
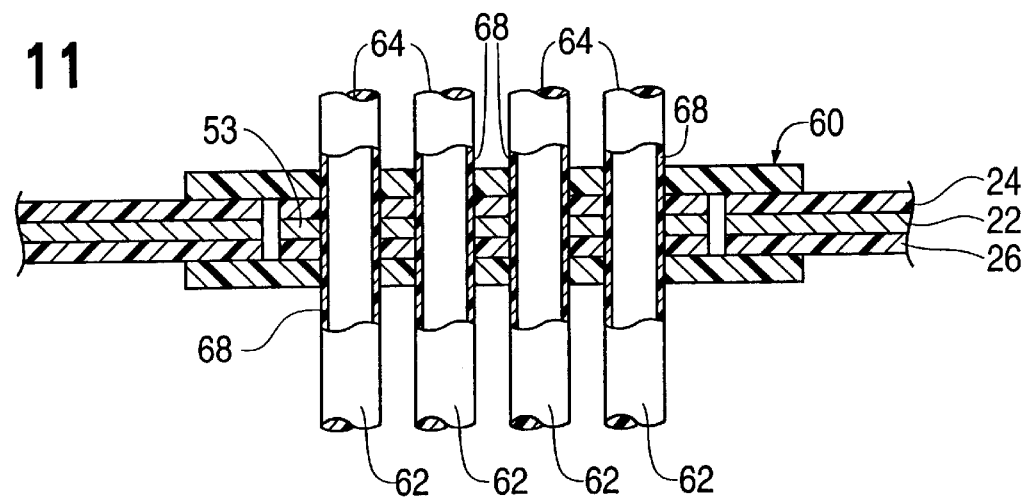
FIG. 11 is a view similar to FIG. 6 of part of a modified method of assembly of the printed circuit board into the container of the first embodiment.

In the fourth embodiment (FIG. 11), the printed circuit 12 and connector 14 are provided as in previous embodiments. In the fourth embodiment, however, the conductors which extend from terminals of the connector 14 and through a carrier 60 are composed entirely of individually electrically insulated conductor wires 62. These wires 62 pass through the carrier 60 which is molded around the wires so that end regions 64 of the conductor wires project exteriorly of the container in the finished assembly for connection to other electrical equipment. As also shown by FIG. 11, the carrier 60 may be of basically the same construction as the carrier 50 of the third embodiment, but in the fourth embodiment, the EMI protection layer is separated from each of the conductor wires 62 by the insulation layer 68 on each of the wires.

Figure 12:
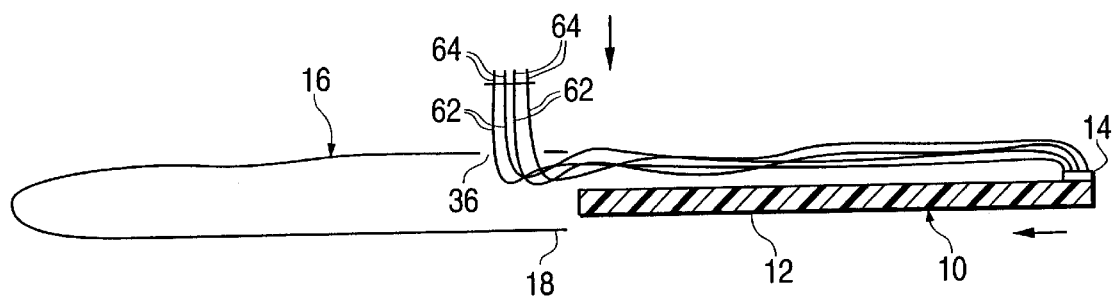
FIG. 12 is a side elevational view of part of an assembly according to a fourth embodiment.
Figure 13:
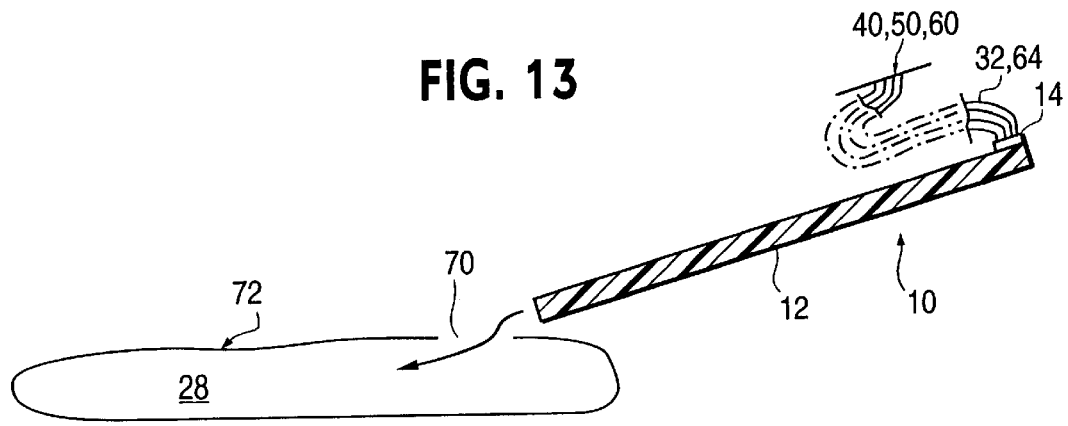
FIGS. 13 and 14 show stages in a method of assembly of a structure according to a fifth embodiment.
Figure 14:
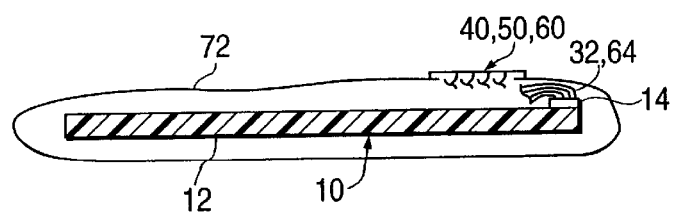

In the fourth embodiment the finished assembly of the carrier 60, conductor wires 62 and printed circuit board 12 with its connector 14 is then passed through the open end 18 of the container 16. The wires 62 are passed through the aperture 36 to position the carrier 60 outside the container as shown in FIG. 12. The open end 18 is then closed to provide the closed end 30, not shown in FIG. 12, and the carrier 60 is moved in the direction of the arrow in FIG. 12 to mount it in the position of the carrier 50 in the third embodiment to be sealed to close the opening 36. It is not an essential requirement of the invention that the carrier for the conductors or the electrically conductive elements as the case may be, should be placed upon and sealed across an aperture which is separate from the opening to the container and through which the printed circuit board 12 is inserted. For instance as shown in a fifth embodiment of FIGS. 13 and 14, a single opening 70 is provided towards one end of the container 72. The opening is sufficiently large to enable the printed circuit board 12 to be passed through it together with its connector 14 as shown by the arrow in FIG. 13. When the printed circuit board and its connector are disposed within the chamber 28, then the carrier, which may be of any construction including the constructions described in the above embodiments, is placed upon or within the opening 70 to be sealed in position so as to close the chamber from ambient atmosphere.

What is claimed is:

1. A flexible container defining a chamber for containing an electronic device, the container comprising:
    a laminate construction wall having a dielectric layer facing inwardly into the chamber and an EMI protection layer surrounding the dielectric layer, the laminate construction wall defining an aperture;
    a closeable opening to the chamber;
    a plurality of electrically conductive elements present in a wall region of the container, the electrically conductive elements electrically isolated from each other and also from the EMI protection layer, and each of the conductive elements having one end facing into the chamber for electrical connection to a conductor within the container and another end facing outwards from the chamber for connection to a conductor outside the container; and
    a carrier, provided in the aperture and having a laminate construction, which holds the electrically conductive elements and bridges and closeably seals the aperture.

2. A container according to claim 1 wherein the laminate construction wall comprises three layers which include a further dielectric layer surrounding the EMI protection layer, and around marginal regions of the aperture, the dielectric layers provide aperture defining dielectric projections extending beyond the EMI protection layer and the carrier has edge regions which extend between and are sealed to the projections.

3. A container according to claim 1 wherein the laminate construction wall comprises three layers which includes a further dielectric layer surrounding the EMI protection layer and the carrier is disposed in sealing engagement with one of the inner and outer surfaces of the container.

4. A container according to claim 1 further comprising an electrical connector having electrical terminals each electrically connected to a flexible individually insulated conductor wire which is electrically connected to an inwardly facing end of an individual electrically conductive element.

5. A container according to claim 1 wherein the carrier includes an EMI protection carrier layer which is electrically isolated from the electrically conductive elements.

6. A method of making a flexible container defining a chamber for containing an electronic device comprising:
    providing a partly finished container having a laminate construction wall comprising a dielectric layer facing inwardly into the chamber and an EMI protection layer surrounding the dielectric layer, the laminate construction wall defining a closeable opening to the chamber, and an aperture through the laminate construction wall of the partly finished container; and
    bridging and closing the aperture with a carrier having a laminate construction which includes at least one dielectric carrier layer and a plurality of electrically conductive elements held by the carrier, the conductive elements electrically isolated from each other and also from the EMI protection layer and each element having conductive ends located at opposite sides of the carrier, the carrier being sealably secured to the laminate construction wall with conductive ends of the conductive elements providing ends facing into the chamber for electrical connection to the electronic device and ends facing outwards from the chamber for connection to a conductor outside the container.

7. A method according to claim 6 wherein the laminate construction wall comprises three layers which includes a further dielectric layer surrounding the EMI protection layer and, around marginal regions to the aperture, the dielectric layers provide aperture defining dielectric projections extending beyond the EMI protection layer, the method comprising inserting the edge regions of the carrier between the projections of the two dielectric layers and sealably securing them thereto.

8. A method according to claim 6 wherein the laminate construction wall comprises three layers which include a further dielectric layer surrounding the EMI protection layer and the method comprises disposing the carrier outside of the further dielectric layer with the edge regions of the carrier overlapping the further dielectric layer and sealing the edge regions of the carrier to the further dielectric layer.

9. A method according to claim 6 wherein the carrier includes an EMI protection carrier layer, the method including electrically isolating the electrically conductive elements from the EMI protection carrier layer.

10. An assembly of an electronic device inside a flexible container comprising:

an electronic device having a plurality of electrical terminals; and a flexible container defining a closed chamber containing the electronic device, the container having a laminate construction wall which comprises a dielectric layer facing inwardly into the chamber and an EMI protection layer surrounding the dielectric layer, the laminate construction wall defining an aperture;

a plurality of electrical conductors electrically isolated from one another and electrically connected to electrical terminals of the electronic device, with first parts of the conductors within the chamber flexibly extending to a wall region of the container and second parts of the conductors extending through and being held by the wall region of the container to provide ends of the second parts of the conductors facing outwards from the container for connection to electrical conductors outside the container; and a carrier, provided in the aperture and having a laminate construction, which holds the electrically conductive elements and bridges and closeably seals the aperture.

11. An assembly according to claim 10 wherein the first parts of the conductors are provided by individually insulated conductor wires and the second parts of the conductors are provided by electrical conductor elements discretely positioned in the wall region of the container, and each of the conductor wires is electrically connected to an individual electrical conductor element.

12. An assembly according to claim 11 wherein the laminate construction wall comprises three layers which include a further dielectric layer surrounding the EMI protection layer and around marginal regions to the aperture, the dielectric layers provide aperture defining dielectric projections extending beyond the EMI protection layer and the carrier has edge regions which extend between and are sealed to the projections.

13. An assembly according to claim 12 wherein the laminate construction wall comprises three layers which include a further dielectric layer surrounding the EMI protection layer, and the carrier is disposed in sealing engagement with one of the inner and outer surfaces of the container.

14. An assembly according to claim 10 wherein the carrier includes an EMI protection carrier layer which is electrically isolated from the individually insulated conductors.

15. An assembly according to claim 14 wherein the whole of each electrical conductor is provided by a conductor wire which extends through the container wall to provide exterior wire portions for connection to a conductor outside the container.

16. A method of assembling an electronic device inside a flexible container comprising:

providing a flexible container defining a chamber and having a laminate construction wall comprising a dielectric layer facing inwardly into the chamber and an EMI protection layer surrounding the dielectric layer, the container also defining an opening to the chamber for insertion of the device into the chamber and an aperture;

providing a preformed assembly of the electronic device, individually insulated electrical conductors and a carrier having a laminate construction and a dielectric surface on one side, with the conductors passing through the carrier and second parts of the conductors sealingly held by the carrier;

inserting the preformed assembly through the opening and into the chamber with first parts of the conductors electrically connected to electrical terminals of the electronic device; and closing the chamber with the first parts of the conductors within the chamber and the second parts of the conductors extending through a wall region of the container and being electrically isolated from the EMI protection layer with outer ends of the conductors facing outwards from the container for connection to electrical means outside the container.

17. A method according to claim 16 comprising providing the first parts of the conductors as individually insulated conductor wires and the second parts of the conductors as electrical conductor elements discretely positioned in the wall region of the container, the method comprising electrically connecting each conductor wire to an individual electrical conductor element.

18. A method according to claim 17 comprising:

electrically connecting each conductor wire to its individual electrically conductive element; and then closing the chamber including securing the carrier to the laminate wall structure with the dielectric surface of the carrier facing into the chamber.

19. A method according to claim 18 comprising sealing the carrier to the laminate construction wall at the edges of the opening to seal the chamber.

20. A method according to claim 18 wherein the container also includes an aperture, and the method comprises causing the carrier to bridge the aperture and then closing the chamber by sealing the carrier to the laminate construction wall to seal the aperture, and sealingly closing the opening.

21. A method according to claim 17 wherein the container defines an aperture, the method comprising:

sealing the carrier to the laminate construction wall to close the opening and the aperture, with the electronic device and first parts of the conductors disposed within the chamber.

22. A method according to claim 16 wherein each individually insulated electrical conductor consists entirely of an individually insulated electrical conductor wire, the method comprising:

inserting the electronic device through the opening in the chamber and with the first parts of the conductor wires within the chamber; and sealing the carrier to the laminate construction wall to close the chamber.

23. A method according to claim 22 comprising sealing the carrier to the laminate construction wall at the edges of the opening to seal the chamber.

24. A method according to claim 22 wherein the container also includes an aperture and the method comprises causing the carrier to bridge the aperture and then closing the chamber by sealingly closing the aperture by sealing the carrier to the laminate construction wall to close the aperture and also closing the opening.

* * * * *